US006756801B2

(12) United States Patent
Colby

(10) Patent No.: US 6,756,801 B2
(45) Date of Patent: *Jun. 29, 2004

(54) APPARATUS FOR ELECTRICAL TESTING OF A SUBSTRATE HAVING A PLURALITY OF TERMINALS

(75) Inventor: Paul C. Colby, Sunnyvale, CA (US)

(73) Assignee: Electroglas, Inc., San Jose, CA (US)

( * ) Notice: Subject to any disclaimer, the term of this patent is extended or adjusted under 35 U.S.C. 154(b) by 1 day.

This patent is subject to a terminal disclaimer.

(21) Appl. No.: 10/171,211

(22) Filed: Jun. 11, 2002

(65) Prior Publication Data

US 2002/0149383 A1 Oct. 17, 2002

Related U.S. Application Data

(63) Continuation of application No. 09/604,859, filed on Jun. 27, 2000, now Pat. No. 6,417,683.
(60) Provisional application No. 60/143,196, filed on Jul. 9, 1999.

(51) Int. Cl.$^7$ ............................................... G01R 31/02
(52) U.S. Cl. ..................................... 324/758; 324/158.1
(58) Field of Search ............................... 324/758, 754, 324/755, 756, 757, 158.1; 269/71

(56) References Cited

U.S. PATENT DOCUMENTS 5,672,977 A * 9/1997 Yamada ...................... 524/754
5,982,132 A * 11/1999 Colby ......................... 318/649
6,060,892 A * 5/2000 Yamagata .................... 324/754
6,417,683 B1 * 7/2002 Colby ......................... 324/758

FOREIGN PATENT DOCUMENTS

WO    PCT/US00/18445    10/2000

* cited by examiner

Primary Examiner—Albert Decady
Assistant Examiner—James Kerveros
(74) Attorney, Agent, or Firm—Blakely, Sokoloff, Taylor & Zafman LLP

(57) ABSTRACT

According to one aspect of the invention apparatus is provided for electrical testing of a substrate having a plurality of terminals. The apparatus includes a frame, a probe card, a translation device, an alignment device, and a holder. The probe card includes a probe card backing member and a plurality of probes extending from the probe card backing member and is secured to the frame. The translation device is secured to the frame. The alignment device is located on the translation device. The holder is capable of holding a substrate and is secured to the alignment device. The alignment device is operable to cause alignment movement of the holder past the probe card so that selected ones of the terminals are brought into alignment with selected ones of the probes. The translation device is operable to cause translational movement, transverse to the alignment movement, of the alignment device with the holder towards the probe card. A respective one of the terminals is so brought into contact with a respective contact region of a respective one of the probes.

15 Claims, 4 Drawing Sheets

APPARATUS FOR ELECTRICAL TESTING OF A SUBSTRATE HAVING A PLURALITY OF TERMINALS

This application is a continuation of U.S. patent application Ser. No. 09/604,859, which was filed Jun. 27, 2000, now U.S. Pat. No. 6,417,683.

Priority is claimed from U.S. Provisional Patent Application No. 60/143,196 filed on Jul. 9, 1999.

BACKGROUND OF THE INVENTION

1). Field of the Invention

This invention relates to an apparatus for electrical testing of a substrate having a plurality of terminals.

2). Discussion of Related Art

Substrates such as wafers or other arrays of packaged electronics devices often have active circuits formed within them. Terminals are formed on the substrates to which electrical contact can be made for purposes of testing the circuits before final assembly. Probe cards are used for making electrical contact with the terminals. A probe card includes a plurality of probes which are brought into contact with the terminals. An electrical tester is connected to the probes. Electrical signals can be transmitted from the electrical tester thorough the probes and the terminals to the electrical circuits, or signals can be sent from the circuits through the terminals and probes to the electrical tester.

In order to make proper contact between the probes and the terminals, the substrate and terminals have to be brought into alignment with one another both rotationally and positionally, and then be moved closer to one another. A force has been exercised between the probe card and the substrate to ensure proper contact between contact regions of the probes and the terminals.

FIG. 4 illustrates one apparatus that can be used for aligning and probing of a substrate includes a frame 110, a probe card 112, a horizontal alignment stage 114, and a vertical translation stage 116. The probe card 112 is secured in the top of the frame 110. The alignment stage 114 is located on the base of the frame 110 and the translation stage 116 is located on the alignment stage 114. The alignment stage 114 can be moved in horizontal directions and the translation stage 116 can be moved relative to the alignment stage 114 in a vertical direction. The translation stage 116 generally includes a screw 118 with a holder 120 located on top of the screw 118 for securing a substrate to.

A problem with the apparatus of FIG. 4 is that the screw 118 moves together with the alignment stage 114 in horizontal directions. A center axis of the screw 118 is thus movable relative to a center point of the probe card 112. When the translation stage 116 is moved in an upwardly direction so that the substrate makes contact with the probe card 112, a moment 122 is created because of misalignment of a force created by the probe card 112 with respect to a center axis of the screw 118. The moment 122 has a tendency to topple the translation stage. As a consequence, the screw 118 has to be of a relatively bulky design to be able to counteract the moment that is created.

SUMMARY OF THE INVENTION

According to one aspect of the invention apparatus is provided for electrical testing of a substrate having a plurality of terminals. The apparatus includes a frame, a probe card, a translation device, an alignment device, and a holder. The probe card includes a probe card backing member and a plurality of probes extending from the probe card backing member and is secured to the frame. The translation device is secured to the frame. The alignment device is located on the translation device. The holder is capable of holding a substrate and is secured to the alignment device. The alignment device is operable to cause alignment movement of the holder past the probe card so that selected ones of the terminals are brought into alignment with selected ones of the probes. The translation device is operable to cause translational movement, transverse to the alignment movement, of the alignment device with the holder towards the probe card. A respective one of the terminals is so brought into contact with a respective contact region of a respective one of the probes.

BRIEF DESCRIPTION OF THE DRAWINGS

The invention is further described by way of example with reference to accompanying drawings wherein.

DETAILED DESCRIPTION OF THE INVENTION

Figure 1:
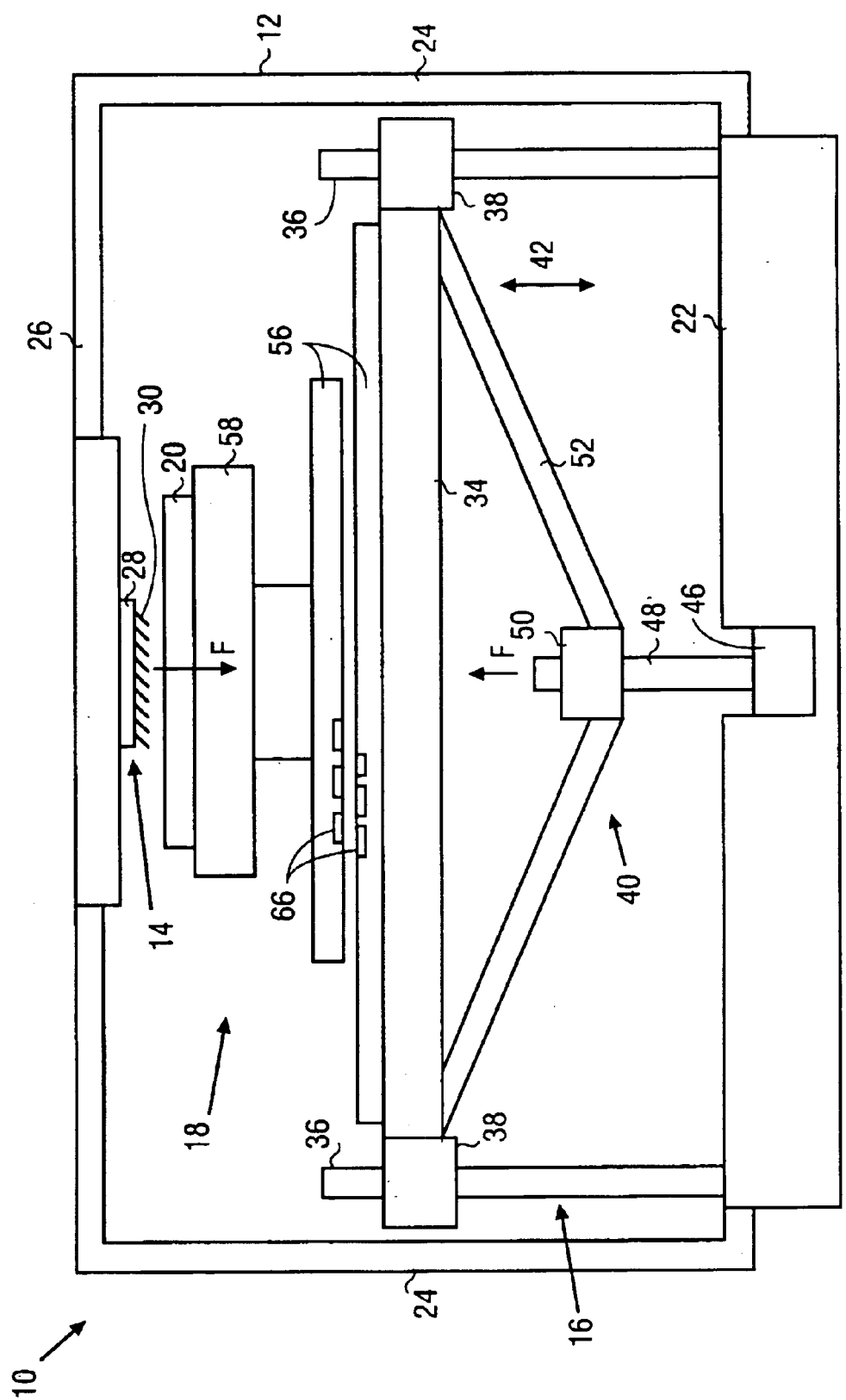
FIG. 1 is a side view illustrating apparatus, according to an embodiment of the invention, for electrical testing of a substrate having a plurality of terminals.

FIG. 1 of the accompanying drawings illustrates an apparatus 10, according to an embodiment of the invention, for electrical testing of a substrate having a plurality of terminals. The apparatus 10 includes a frame 12, a probe card 14, a translation device 16, an alignment device 18, and a holder 20.

The frame 12 includes a base 22, posts 24, and an overhead probe card support structure 26. The base 22 is located on a horizontal surface, the posts 24 are secured to the base 22 and extend upwardly therefrom, and the overheard probe card support structure 26 is secured to and between upper ends of the posts 24.

The probe card 14 includes a probe card backing member 28 and a plurality of probes 30 secured to the probe card backing member 28. The probe card backing member 28 is secured to the overhead probe card support structure 26 in a position wherein the probes 30 extend downwardly from the probe card backing member 28.

The translation device 16 includes a translation stage 34, guide pins 36, guide bearings 38, and a load applicator 40.

Each guide pin 36 is secured to the base 22 and extends upwardly therefrom. Each guide bearing 38 is secured to the translation stage 34. Each guide bearing 38 is located over a respective guide pin 36. The translation stage 34 is moveable in an upward and downward translation direction 42 while the guide pins 36 slide within the guide bearings 38 and confine the movement of the translation stage 34 to the translation direction 42.

The load applicator 40 includes a small electric motor 46, a screw 48, a nut 50, and connector beams 52. The motor 46 is secured to the base 22 and the screw 48 is connected to the motor 46 so that the screw 48 is rotated by the motor 46. The nut 50 is located on the screw 48. The nut 50 and the screw 48 have complementary threaded formations. The nut 50 is connected to the translation stage 34 by the connector beams 52. Rotation of the screw 48 causes rotation of the threaded formation on the screw 48 within the threaded formation within the nut 50. The nut 50 is non-rotationally secured to the translation stage 34 and moves up or down in the translation direction 42 when the screw 48 rotates. Movement of the nut 50 is transferred through the connector beams 52 to the translation stage 34 so that the translation stage 34 moves in the translation direction 42 when the screw 48 rotates. The screw 48 can be rotated in opposite directions to cause either upward or downward movement of the translation stage 34 in the translation direction 42.

Figure 2:
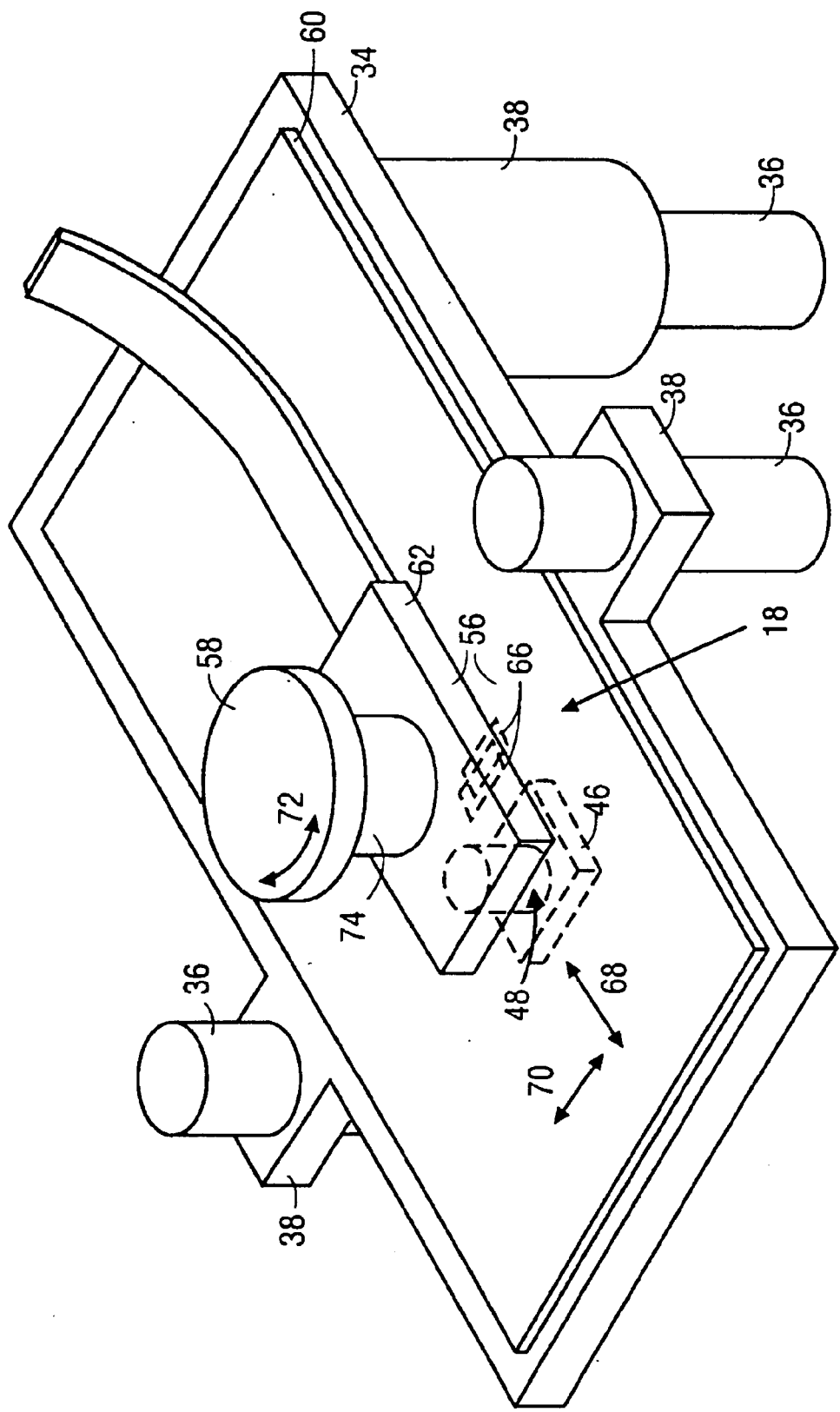
FIG. 2 is a perspective view of components of the apparatus of FIG. 1.

Reference is also made to FIG. 2 which illustrates the alignment device 18 located on the translation stage 34 in more detail. The alignment device 18 includes a Sawyer motor 56 which is used for horizontal alignment, and a rotation stage 58 that is used for rotational alignment.

The Sawyer motor 56 includes a Sawyer platen 60 located on the translation stage 34 and a Sawyer forcer 62 located on the Sawyer platen 60. Sawyer motors are well known in the art and have been used in X-Y stages for semiconductor wafer probers, such as wafer probers of Electgroglas, Inc., of Santa Clara, Calif. The Sawyer forcer 62 rides on an air bearing located between the Sawyer forcer 62 and the Sawyer platen 60 and serves as an alignment stage for a substrate. A positioning actuator is provided in the form of magnets and electgromagnets 66 located on the Sawyer platen 60 and the Sawyer forcer 62. The magnets and electromagnets 66 provide a connection between the Sawyer platen 60 and the Sawyer forcer 62 so that, when operated, the Sawyer forcer 62 is moved in transverse alignment directions 68 and 70 over the Sawyer platen 60. Other details of Sawyer motors will be evident to one skilled in the art.

The rotation stage 58 is located on the Sawyer forcer 62 and is rotatable in a direction 72. An electric motor 74 rotates the rotation stage 58 in the direction 72.

Figure 3A:
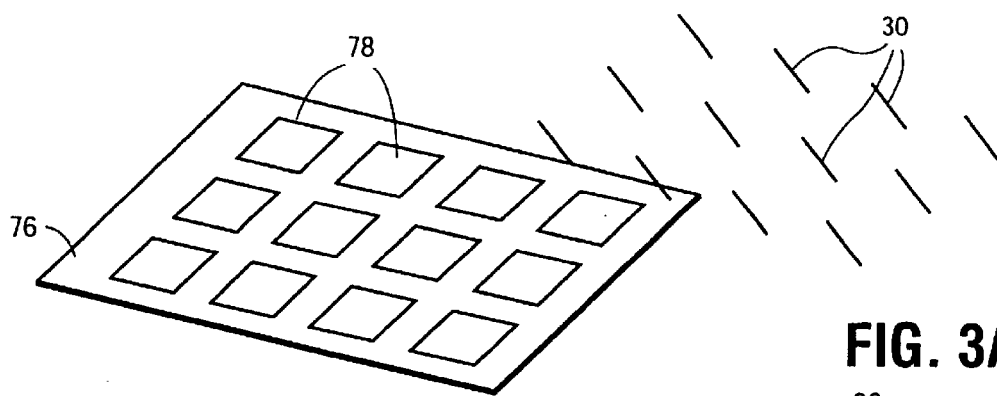
FIG. 3a is a perspective view of a substrate and terminals which have to be brought into contact with one another using the apparatus of FIG. 1.
Figure 3B:
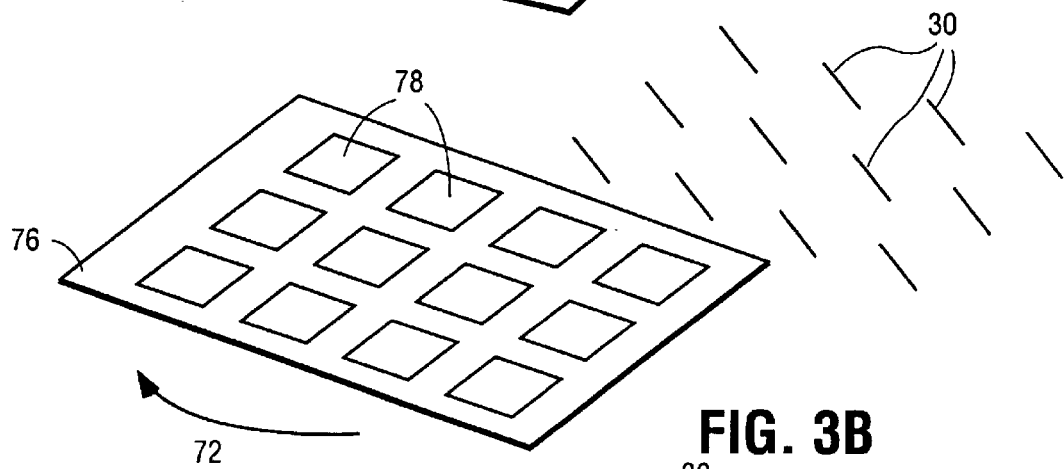
FIG. 3b is a view similar to FIG. 3a after the substrate is rotated.

The operation of the apparatus 10 is now described with reference to FIG. 1, FIG. 2, and FIG. 3a to FIG. 3d. A substrate 76 having a plurality of terminals 78 located thereon is located on the holder 20. The holder 20 may for example be a vacuum chuck which retains the substrate 76. As shown in FIG. 3a, the terminals 78 and the probes 30 may initially be misaligned. As shown in FIG. 3b, the substrate 76 is typically rotated in a direction 72 by rotating the rotation stage 58. The substrate 76 is thus rotated about an axis transverse to a plane of the substrate 76. The probes 30 may then still not be located over the terminals 76, although the terminals 76 and the probes 30 may be rotationally aligned in the sense that the probes 30 are located in rows that are parallel to rows of the terminals 78.

Figure 3C:
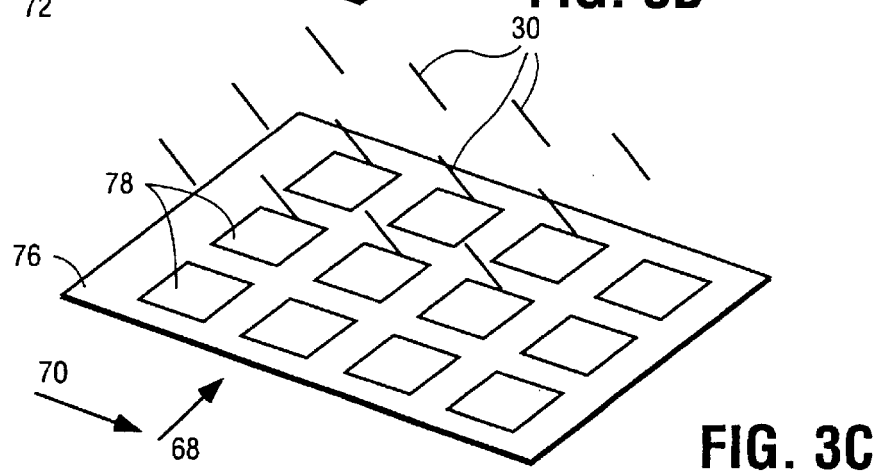
FIG. 3c is a view similar to FIG. 3b after the substrate is moved so that each terminal is located directly below each probe.
Figure 3D:
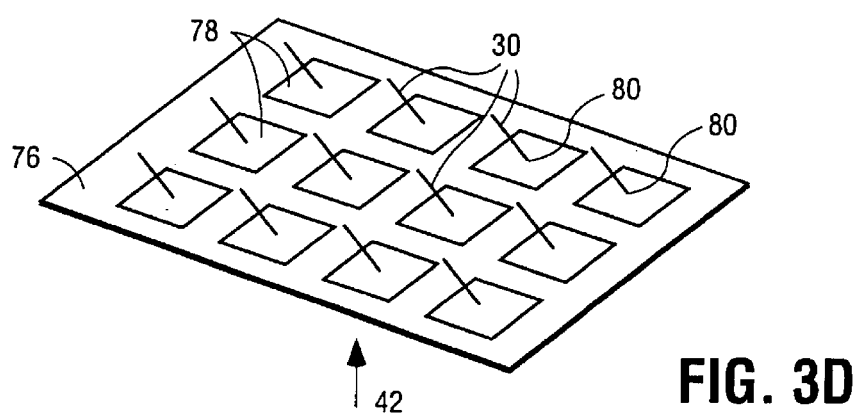
FIG. 3d is a view similar to FIG. 3c after the substrate is moved in an upward direction so that each terminal contacts a respective contact region of a respective one of the probes.
Figure 4:
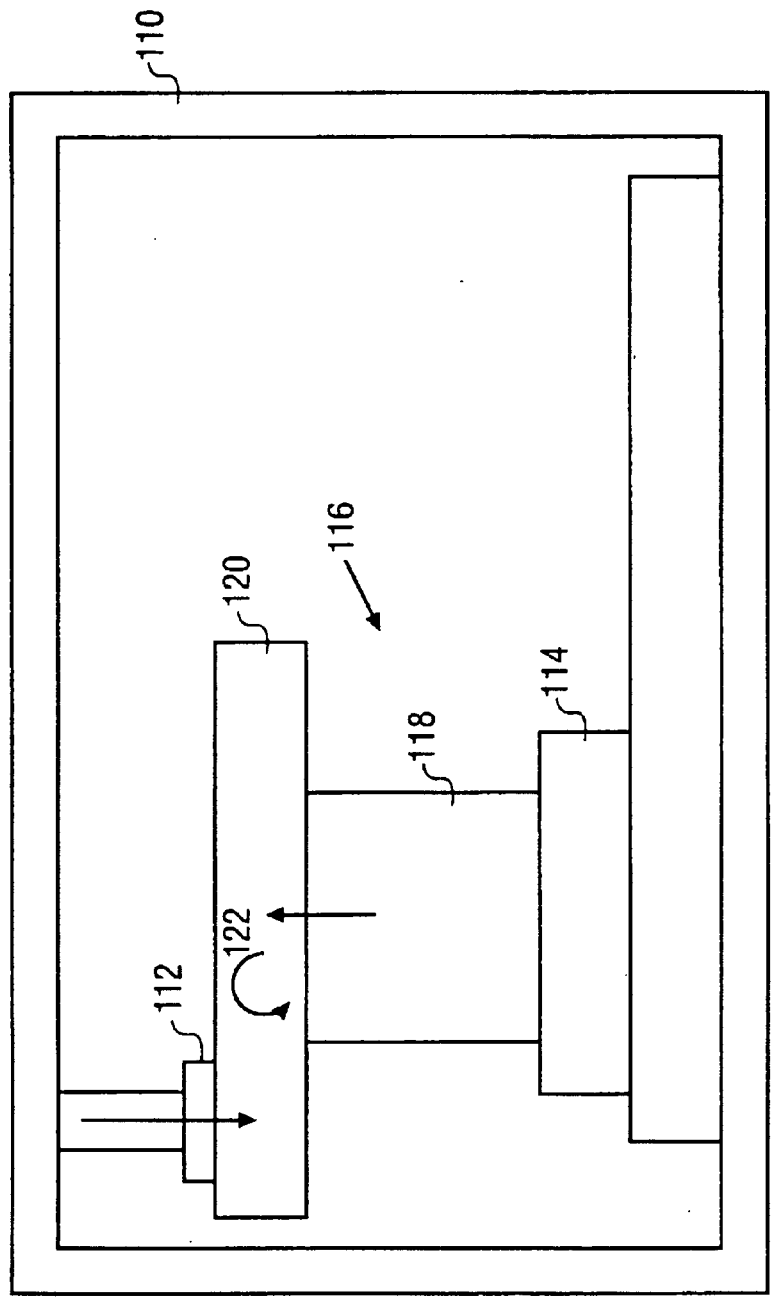
FIG. 4 is a side view illustrating apparatus for electrical testing of a substrate according to the prior art.

As shown in FIG. 3c, the substrate 76 is then moved in a direction 70 and a direction 68 by moving the Sawyer forcer 62 over the Sawyer platen 60. Each one of the probes 30 is then located over a respective one of the terminals 78.

The electric motor 46 is then operated so that the translation stage 34, the Sawyer motor 56, the rotation stage 58, the holder 20, and the substrate 76 move in a direction 42 towards the probe card 14. Each one of the terminals 78 is thereby brought into contact with a contact region 80 of a respective one of the probes 30. In order to ensure that proper contact is made, the substrate 76 is moved further into the direction 42, thereby deflecting the probes 30. Because of the deflection, a force is exercised by the probes 30 on the substrates 76. The force is counteracted by the screw 48.

It should be noted that the screw 48 is at all times located directly below the probe card 14. The force exercised by the probes 30 is downward and directly aligned with a center axis of the screw 48. Should the force not be aligned with a center axis of the screw 48, a moment would be created which will tend to topple the translation stage 34. However, because the force of the probes 30 is aligned with a center axis of the screw 48, no moment is created. It should also be noted that although no moment is created because the probe card 14 is located directly above the screw 48, positional alignment as shown in FIG. 3c is still allowed for because of the use of an alignment stage in the form of the Sawyer forcer 62 on top of the translation stage 34. Substantially the same advantages can be accomplished with a slight offset in alignment.

A prior art device wherein a moment in created due to misalignment of a translation screw with respect to a probe card requires a much larger translation screw and motor. The larger translation screw is necessary to counteract the moment created in the present embodiment. By contrast, a very small motor 46 and translation screw 48 are used in the embodiment in FIG. 1 because no moment is created. Overall rigidity is ensured because of the use of linear bearings including the guide pins 36 and guide bearings 38.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art. Other embodiments are therefore possible without departing from the scope and spirit of the invention. One alternative embodiment, for example, may replace the Sawyer motor 56 with another horizontal alignment device such as a gantry alignment device. A gantry alignment device may include a set of parallel rails, a third rail and a support component. The set of parallel rails are secured between two mounting blocks. The third rail extends transverse to the set of parallel rails and is secured between the set of parallel rails. The third rail can move along the set of parallel rails. The support component is secured to the third rail and is movable along its length. Such a device can be used for X-Y positioning of a substrate.

What is claimed:

1. Apparatus for electrical testing of a substrate having a plurality of first contact regions, comprising:

a frame;

a contact assembly having a plurality of second contact regions, said contact assembly being secured to the frame;

a translation device secured to the frame;

an alignment device carried by the translation device so that the translation device is mounted between the frame and the alignment device; and a holder, capable of holding the substrate, secured to the alignment device, wherein:

(i) the alignment device is operable to cause alignment movement of the holder relative to the contact assembly so that selected ones of the first contact regions are brought into alignment with selected ones of the second contact regions; and (ii) the translation device is operable to cause translation movement, transverse to the alignment movement, of the alignment device with the holder towards the contact assembly so that a respective one of the first contact regions is brought into electrical contact with a respective second contact region.

2. An apparatus according to claim 1 wherein the alignment device is operable to move the holder in at least a first alignment direction and a second alignment direction transverse to the first alignment direction.

3. An apparatus according to claim 2 wherein the alignment device is operable to rotate the holder about an axis transverse to a plane of the substrate.

4. An apparatus according to claim 1 wherein the holder and the contact assembly are rotatable relative to one another about an axis transverse to a plane of the substrate.

5. An apparatus according to claim 2 wherein the alignment device causes the alignment movement while the translation device and the contact assembly can remain stationary relative to one another in the alignment directions.

6. An apparatus according to claim 1 wherein the translation device includes:

a translation stage on which the alignment device is located; and a load applicator which is connected between the translation stage and the frame and operable to cause the translational movement of the translation stage relative to the frame.

7. An apparatus according to claim 6 wherein the translation device includes:

at least one guide bearing; and a respective guide pin in each guide bearing, one of the guide bearing and the guide pin being secured to the frame and the other being secured to the translation stage so that the guide pin slides within the guide bearing during the translational movement of the translation stage relative to the frame.

8. Apparatus for electrical testing of a substrate having a plurality of terminals, comprising:

a frame;

a contact assembly having a plurality of contact regions, said contact assembly being secured to the frame;

a translation stage secured to the frame for translational movement towards and away from the contact assembly;

a load applicator connected between the frame and the translation stage so that operation of the load applicator causes the translational movement of the translation stage;

an alignment stage carried by the translation stage for alignment movement in a direction transverse to the translational movement relative to said contact assembly;

a positioning actuator providing a connection between the translation stage and the alignment stage so that operation of the positioning actuator causes the alignment movement of the alignment stage; and a holder, capable of holding the substrate, located on the alignment stage, wherein:

(i) the alignment movement causes movement of the alignment stage and the holder relative to said contact assembly so that selected ones of the contact regions are brought into alignment with selected ones of the terminals; and (ii) the translational movement causes movement of the translation stage, the alignment stage and the holder towards the contact assembly so that a respective one of the contact regions is brought into contact with a respective one of the terminals.

9. An apparatus according to claim 8 wherein the load applicator is a screw which, upon rotation within a thread, causes the translational movement.

10. An apparatus according to claim 9 further comprising:

at least one guide bearing; and a respective guide pin in each guide bearing, one of the guide bearing and the guide pin being secured to the frame and the other being secured to the translation stage so that the guide pin slides within the guide bearing the translational movement of the translation stage relative to the frame.

11. An apparatus according to claim 8 wherein the positioning actuator includes at least one electromagnet.

12. An apparatus according to claim 11 wherein the positioning actuator is part of a Sawyer motor.

13. An apparatus according to claim 8 wherein the holder and the contact assembly are rotatable relative to one another, further comprising:

a rotation actuator which rotates the holder and the contact assembly relative to one another.

14. An apparatus according to claim 13 further comprising:

a rotation stage on the alignment stage, the holder being located on the rotation stage and the rotation stage being rotatable relative to the alignment stage about an axis transverse to a plane of the substrate.

15. An apparatus according to claim 14 wherein rotation of the rotation stage brings selected ones of the contact regions into alignment with selected ones of the terminals.

* * * * *